(12) United States Patent
Bieri et al.

(10) Patent No.: US 7,046,004 B2
(45) Date of Patent: May 16, 2006

(54) GENERIC EDDY-CURRENT COMPENSATION IN MAGNETIC RESONANCE IMAGING

(75) Inventors: Oliver Bieri, Basel (CH); Klaus Scheffler, Basel (CH)

(73) Assignee: University of Basel, Basel (CH)

( * ) Notice: Subject to any disclaimer, the term of this patent is extended or adjusted under 35 U.S.C. 154(b) by 0 days.

(21) Appl. No.: 11/123,195

(22) Filed: May 6, 2005

(65) Prior Publication Data

US 2005/0258829 A1    Nov. 24, 2005

Related U.S. Application Data

(60) Provisional application No. 60/568,853, filed on May 7, 2004, provisional application No. 60/587,506, filed on Jul. 14, 2004.

(51) Int. Cl.
*G01V 3/00* (2006.01)
(52) U.S. Cl. .................. 324/307; 324/309; 324/306
(58) Field of Classification Search .......... 324/307, 324/309, 306
See application file for complete search history.

(56) References Cited

U.S. PATENT DOCUMENTS

| | | | |
|---|---|---|---|
| 4,769,603 A | | 9/1988 | Oppelt et al. |
| 4,973,906 A | * | 11/1990 | Bernstein .................. 324/309 |
| 5,455,512 A | * | 10/1995 | Groen et al. .............. 324/309 |
| 6,815,952 B1 | * | 11/2004 | Rose et al. ................ 324/307 |

OTHER PUBLICATIONS

Foxall DL, "Frequency-modulated steady-state free precession imaging", Magn Reson Med 2002; 48:502-508.*
Nayak KS, Hargreaves BA, Hu BS, Nishimura DG, Pauly JM, Meyer CH, "Spiral balanced steady-state free precession cardiac imaging", Magn Reson Med 2005; 53:1468-1473.*
Spincemaille P, Nguyen TD, Wang Y, "View Ordering for Magnetication Prepared Steady State Free Precession Acquiaition: Application in Contrast-Enhanced MR Angiography", Magn Reson Med 2005; 52:461-466.*

* cited by examiner

*Primary Examiner*—Michael Tokar
*Assistant Examiner*—Jeremiah Shipman
(74) *Attorney, Agent, or Firm*—Griffin & Szipl, P.C.

(57) ABSTRACT

A method of steady-state free precession MR imaging is provided that includes the steps of: (a) providing a balanced steady-state free precession imaging sequence that includes a plurality of phase encoding steps, wherein each phase encoding step comprises a phase encoding gradient and a slice selection gradient; and (b) acquiring imaging data by performing the plurality of phase encoding steps in sequence, wherein the imaging data is acquired is compensated for one or more effects due to eddy-currents, flow, or motion related artefacts due to the implementation of one or more artefact compensation strategies that consist of (i) "pairing" of consecutive phase encoding steps and of (ii) "through slice equilibration" of eddy-current and motion or flow related signal oscillations.

14 Claims, 8 Drawing Sheets

FIGURE 12 slightly unbalanced, e.g. $\left|\int_0^{TR} G_{slice}(t)dt\right| = \varepsilon > 0$, to induce ±20° off-resonance within TR !

GENERIC EDDY-CURRENT COMPENSATION IN MAGNETIC RESONANCE IMAGING

This application claims priority under 35 U.S.C. § 119 to U.S. Provisional Application No. 60/568,853, filed May 7, 2004 and to U.S. Provisional Application No. 60/587,506, filed Jul. 14, 2004. This application incorporates by reference the entire disclosures of both U.S. Provisional Application No. 60/568,853 and U.S. Provisional Application No. 60/587,506.

FIELD OF THE INVENTION

The present invention pertains generally to a method of magnetic resonance (MR) imaging that acquires imaging data using steady-state free precession sequences, wherein the method compensates for eddy current artefacts, and/or flow related imaging artefacts, produced during imaging by ordering the phase encoding steps and/or modifying the slice selection gradient so as to neutralize these artefacts. In particular, the method in accordance with the present invention utilizes various intrinsic dynamical properties of the steady-state itself to provide a method substantially independent of the MR imaging system and imaging parameters used during MR imaging.

BACKGROUND OF THE INVENTION

Figure 1:
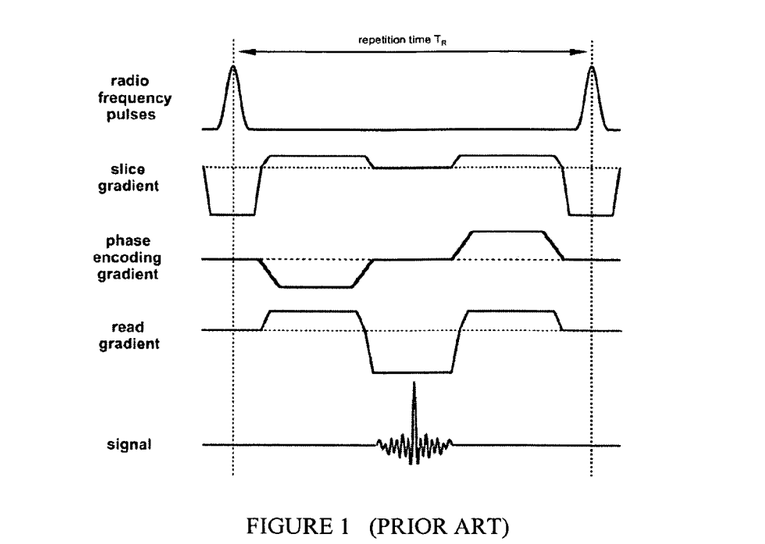
FIG. 1 shows a completely balanced TrueFISP sequence. Image encoding or generally switching of gradients induce dephasing of previously "aligned" spins and "balancing" means that the spin phase is rewinded prior to the next excitation in the radio-frequency train.

Rapid imaging sequences or steady-state free precession (abbreviated, "SSFP") sequences acquire imaging data in a dynamic equilibrium state (i.e., the so called "steady-state"). Due to the heavy duty requirements on system performance, these types of SSFP sequences were not in use until recently. Presently, such imaging sequences have become increasingly popular due to their very fast scanning properties, which are necessary for imaging fast dynamic processes, in abdominal imaging, in cardiac imaging, or when imaging very ill and traumatized patients. There are many different types of steady-state imaging sequences, and a special member of this group is obtained if the time integral of each of the three gradients is zero—e.g. "balanced"—within each repetition time (TR) (see FIG. 1). Such a pulse sequence is disclosed, for example, as FIG. 3 in U.S. Pat. No. 4,769,603, and was originally referred to by the acronym "FISP." However, FISP has been more recently renamed "TrueFISP" (Siemens), or balanced steady-state free precession (b-SSFP) imaging. The excellent signal-to-noise ratio compared to other SSFP sequences and the $T_2$-like contrast makes it useful for several clinical applications.

Although TrueFISP sequences are, to some point, quite robust against long-term and smooth changes of imperfections disturbing the perfectly balanced gradient scheme, rapid and discontinuous changes of residual spin dephasing induced by such imperfections may generate significant signal instabilities and fluctuations leading to image artefacts. One source of image artefacts is the rapidly changing eddy-currents generated during the excitation train and produced by the changing phase encoding (PE) gradients.

It is known that, except for the linear k-space trajectory with small variations between consecutive encoding steps, other encoding schemes such as centric, random or segmented orderings exhibit significant jumps and consequently induce rapidly changing eddy-currents. Another significant source of imperfections in the balanced gradient scheme are motional or flow related imperfections. Although the phase of static spins are perfectly balanced prior to the next excitation, a moving spin picks up a residual phase as a consequence of the motion-sensitive PE gradients. Strictly speaking, TrueFISP sequences are balanced with regard to static spins, (e.g. zeroth order gradient moments are balanced or "nulled" within each repetition time of the excitation train); however, the TrueFISP scheme is not completely balanced with regard to motion or flow where, in addition to the zeroth order moments, there are also first order moments that have to be compensated for.

In summary, phase encoding is the source of two kind of perturbations in the completely balanced TrueFISP gradient scheme, namely: (1) Eddy-current related residual spin-dephasing, and (2) Flow or motion related residual spin-dephasing. With the exception of linear view ordering, also referred to as the "standard" view ordering, where the above two kinds of perturbations are generally smooth and sufficiently small so as not to induce significant signal instabilities in the steady-state, imaging using other non-standard view-orderings, such as centric or segmented view orderings, is significantly affected by eddy currents and/or flow or motion artefacts due to large changes in the amplitude of the phase encoding gradients.

Independently of the origin of these sources of imperfections in the balanced gradient scheme, e.g., eddy-currents or flow, the resulting disturbances induce, dependent on the view ordering used, significant image artefacts, and thus compensation strategies are essential to removing these artefacts from the final image. Direct annihilation of the eddy-current related spin-phase perturbations by applying additional, opposing magnetic fields has been previously investigated, but was limited by uncertainty of the time evolution of induced eddy-currents and other higher order effects. Therefore, there remains a need for a generic compensation strategy that is system and sequence independent and that compensates for eddy-current related residual spin-dephasing, and flow or motion related residual spin-dephasing.

It is generally known that during MR imaging using TrueFISP sequences, pulsed gradients induce eddy-currents in the conducting parts of the magnet, which in turn generate unwanted additional varying magnetic fields that lead to imperfections in the applied gradient scheme. Typically, these induced time-varying fields decay multi-exponentially with time constants on the order of tens to hundreds of milliseconds. Mechanical compensation mechanisms, such as pre-emphasis circuits and shielded coils, are built into state-of-the-art MRI systems to eliminate many of these additional artefactual fields. However, it is generally not possible to perfectly compensate for all of the eddy current-related effects, and consequently, some residual induced fields still persist. Unfortunately, TrueFISP sequences are highly prone to generating imaging imperfections due to these residual fields because TrueFISP sequences require perfectly balanced gradient schemes.

Nevertheless, TrueFISP sequence imaging has the advantage of a dynamic equilibrium state that is quite stable against: (i) Constant residual imperfections, e.g. field inhomogeneities; and (ii) a repetitively constant gradient scheme, as applied in read and slice directions (in 2D acquisitions), which will essentially induce a constant eddy current-related spin dephasing, and establish a corresponding stable steady state.

Figure 2:
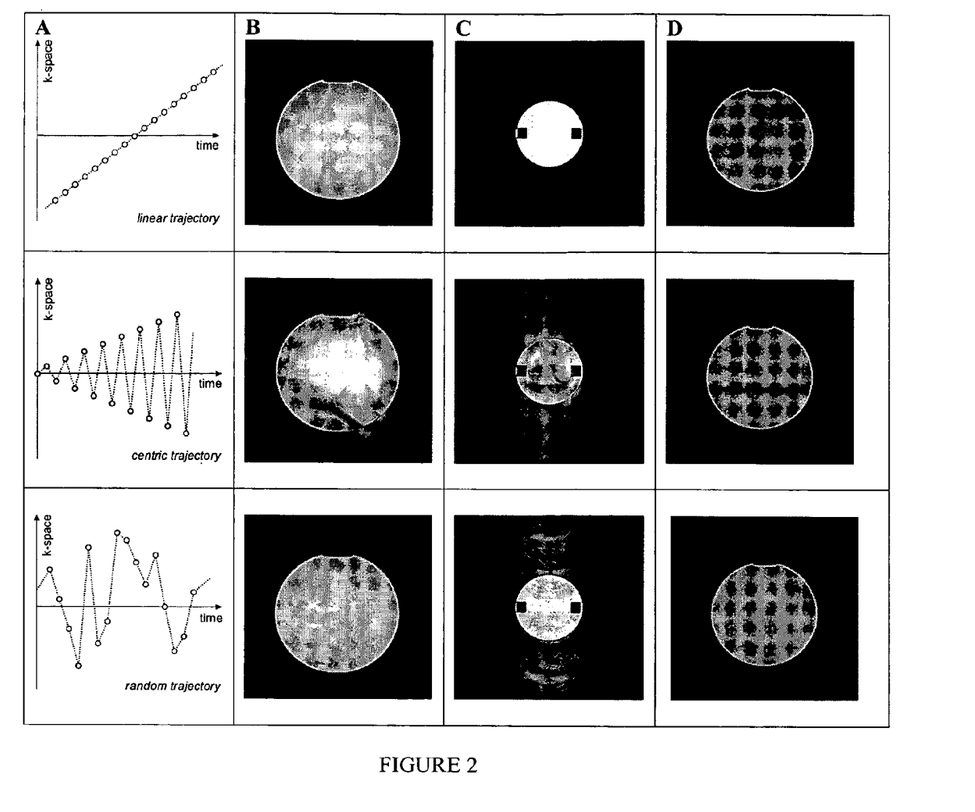
FIG. 2 shows image artifacts produced by eddy-currents due to changes in the encoded k-space trajectories (view-ordering) during steady state. (A) The image degradations depend on the chosen PE scheme (linear—e.g. standard: top, centric: middle, random: bottom). (B,C) Balanced SSFP on a Siemens Sonata system. (D) Non-balanced SSFP (GRASS).

Consequently, the above mentioned imperfections (i.e., residual induced fields) can be refocused by the steady-state and only a permanently changing gradient scheme, as used in the phase encoding direction, may induce sufficiently rapid changes in eddy-currents to produce significant signal instabilities and image artefacts. The resulting fluctuations are thus very closely related to the applied view ordering of the PE gradients, as demonstrated in FIG. 2. FIG. 2 demonstrates that image artefact is different for different view orders. A large change in k-space position, or PE gradient amplitude, between adjacent repetitions (i.e., consecutive phase encoding steps) applied close to the center of k-space is especially critical for the balanced SSFP scheme, as shown by the examples in FIG. 2 corresponding to linear, centric, or random view orderings. Repetitively applied linear PE schemes show minor artefacts since signal instabilities are confined to the outer parts of k-space. As a practical matter, TrueFISP sequences have been limited to application to MR imaging using linear view-orderings only.

In other words, the prior art TrueFISP imaging has been limited by the following technical problem. Balanced SSFP is especially sensitive to residual imperfections (i.e., eddy-current related residual magnetic fields & motion or flow related uncompensated residual first order phase encoding moments) that are induced by the stepwise changing of phase encoding gradients. With the exception of view orderings employing linear k-space trajectories with small variations between consecutive phase encoding steps, any other encoding scheme, such as centric, random or segmented view orderings, exhibit significant jumps between adjacent k-space positions. These relatively large jumps between adjacent k-space positions consequently induce rapidly changing eddy-currents. As demonstrated in FIG. 2, the resulting image artefacts depend on the chosen PE scheme. In contrast to the linear view ordering (also known as the standard view ordering) shown in column A, upper row, of FIG. 2, other alternative view-orderings induce significant perturbations in steady-state magnetization, and thus yield image artefacts and image degradations. Such a similar behaviour is not observed in non-balanced SSFP sequences, such as shown for a GRASS (non-balanced read and slice gradient, balanced phase encode gradient, no rf spoiling) sequence provided in column D in FIG. 2.

Figure 3:
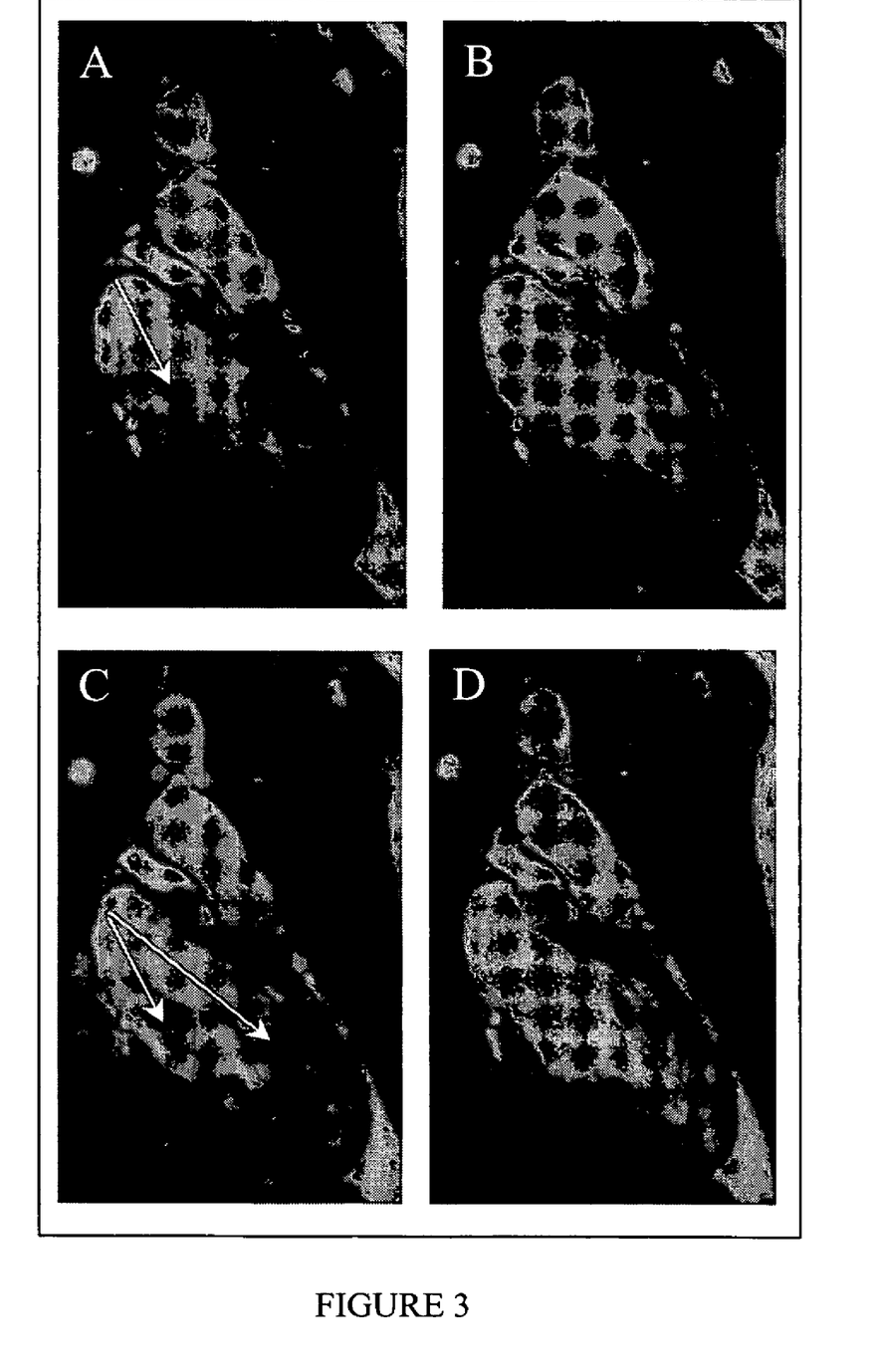
FIG. 3 shows segmented Cine-SSFP imaging (matrix 256×256, TR=5 ms, bw=890 Hz). (A,C) Image artifacts and degradations arise due to the segmentation related larger spin-phase variations (B,D) Compensation of flow related misregistration and signal loss by nulling first order gradient moments using a motion compensated b-SSFP scheme.

Thus, phase encoding gradients are a source of two kinds of imperfections: (i) Eddy-current related imperfections as shown in FIG. 2, and (ii) motion or flow related imperfections as shown in FIG. 3. The eddy current related imperfections are the result of abrupt changes in the characteristics (amplitude, rise times, timing . . . ) of image encoding gradients, as generated by non-linear view orderings, which induce discontinuous changes in eddy-current related residual magnetic fields. The flow or motion related imperfections are the result of abrupt changes in the residual first order moment of image encoding gradients, as generated by non-linear view orderings, which induce discontinuous changes in residual spin-phase. These abrupt changes lead to imperfections (e.g. an additional spin phase) in the balanced TrueFISP sequence scheme that cannot be refocused by the steady-state and thus leads to image degradations and artefacts.

Thus rapid and abrupt changes in the PE gradients, as a consequence of alternative view-orderings, such as centric, random, segmented and others, may induce significant perturbations in the steady-state leading to image artefacts and degradations. Methodological compensation mechanisms to correct for these imaging related imperfections in the totally balanced gradient scheme of TrueFISP sequences, in order to allow application of arbitrary view-orderings, are needed. There has heretofore been no compensation method for compensating for phase encoding related perturbations in steady-state magnetization of balanced SSFP imaging that allows arbitrary, e.g. non-linear, view orderings in TrueFISP sequences.

Thus, the present invention endeavors to provide a method of steady-state free precession MR imaging that maintains the advantages of balanced SSFP imaging while overcoming the limitations of the prior art methods.

Accordingly, one object of the present invention is to overcome the disadvantages and limitations of the prior art balanced SSFP methods.

Another object of the present invention is to provide a method of steady-state free precession MR imaging that compensates for phase encoding related perturbations in steady-state magnetization of balanced SSFP imaging so as to permit arbitrary, e.g. non-linear, view orderings in TrueFISP sequences.

SUMMARY OF THE INVENTION

In accordance with the above objectives, the present invention provides a method of steady-state free precession MR imaging that includes the steps of: (a) providing a balanced steady-state free precession imaging sequence that includes a plurality of phase encoding steps, wherein each phase encoding step comprises a phase encoding gradient and a slice selection gradient; and (b) acquiring imaging data by performing the plurality of phase encoding steps in sequence, wherein the imaging data acquired is compensated for image artefact caused by residual spin dephasing due to either eddy-currents or residual uncompensated first order phase encoding gradient moments arising from flow or motion, or the imaging data acquired is compensated for image artefact caused by residual spin dephasing due to both eddy-currents and residual uncompensated first order phase encoding gradient moments arising from flow or motion, wherein compensation for image artefact is obtained by either performing phase encoding gradients as pairs in k-space, or by performing the slice selection gradient as a slightly unbalanced slice selection gradient in order to achieve through slice equilibrium, or by performing the phase encoding gradient with the paired trajectory and by performing the slice selection gradient as the slightly unbalanced slice selection gradient.

In accordance with the second embodiment of the present invention, the first embodiment is further modified so that the sequence of the phase encoding steps is performed with a k-space trajectory that compensates for the effects of eddy-currents and/or flow or motion. In accordance with a third embodiment of the present invention, the second embodiment is further modified so that the k-space trajectory is a paired trajectory, wherein a first phase encoding step is paired with and precedes a second phase encoding step so that cyclic motion of steady state magnetization projects a phase error generated by the first phase encoding step into a phase error, with opposite sign, of the second encoding step so that coding of a nearby line repeats almost the same phase error, thereby cancelling overall phase error prior to a next excitation. In accordance with a fourth embodiment of the present invention, the third embodiment is further modified so that the k-space paired trajectory is arbitrary in the sense that any encoding of line i precedes or follows encoding of line i+1, or precedes or follows encoding of line i+2, which is less effective than encoding with line i+1.

In accordance with a fifth embodiment of the present invention, the fourth embodiment is further modified to include the step of: generating an image using the imaging data, wherein the image is substantially without image artefact due to eddy currents and/or flow or motion.

In accordance with a sixth embodiment of the present invention, the fourth embodiment is further modified so that slight unbalancing of the slice selection gradient is due to modification of the zeroth order moment of the components of the slice selection gradient selected from the group consisting of a slice selection rewinding gradient, a slice selection dephasing gradient, and a slice selection rewinding and dephasing gradient, wherein the unbalanced gradient induces a voxel independent, symmetric intravoxel off-resonance that is constant and compensates for one of more effects due to eddy currents, flow and/or motion by equilibrating signal oscillations at positive off-resonance frequencies with negative off-resonance frequencies. In accordance with a seventh embodiment, the sixth embodiment is further modified to include the step of: generating an image using the imaging data, wherein the image is substantially without image artefact due to eddy currents. In accordance with an eighth embodiment, the sixth embodiment is further modified to include the step of: generating an image using the imaging data, wherein the image is substantially without image artefact due to eddy currents and substantially without image artefact due to flow or motion.

In accordance with a ninth embodiment of the present invention, the first embodiment is further modified so that slight unbalancing of the slice selection gradient is due to modification of the zeroth order moment of the components of the slice selection gradient selected from the group consisting of a slice selection rewinding gradient, a slice selection dephasing gradient, and a slice selection rewinding and dephasing gradient, wherein the unbalanced gradient induces a voxel independent, symmetric intravoxel off-resonance that is constant and compensates for one or more effects due to eddy currents, flow, and/or motion by equilibrating signal oscillations at positive off-resonance frequencies with corresponding negative off-resonance frequencies In accordance with a tenth embodiment of the present invention, the ninth embodiment is further modified to include the step of: generating an image using the imaging data, wherein the image is substantially without image artefact due to eddy currents.

In accordance with a eleventh embodiment of the present invention, the ninth embodiment is further modified to include the step of: generating an image using the imaging data, wherein the image is substantially without image artefact due to flow or motion. In accordance with a twelfth embodiment of the present invention, the ninth embodiment is further modified to include the step of: generating an image using the imaging data, wherein the image is substantially without image artefact due to eddy currents and substantially without image artefact due to flow or motion. In accordance with a thirteenth embodiment of the present invention, the first embodiment is further modified so that the sequence of the phase encoding steps is performed with a k-space trajectory that is a paired trajectory selected from the group consisting of a linear pair trajectory, a centric pair trajectory, a segmented pair trajectory, and a random pair trajectory.

Thus, the method of MR imaging, in accordance with the present invention, utilizes one or more artefact compensation strategies that consist of (i) "pairing" of consecutive phase encoding steps and of (ii) "through slice equilibration" of eddy-current and motion or flow related signal oscillations. Both "pairing" of phase encoding steps and "through slice equilibration" are easy to implement techniques, and allow arbitrary k-space trajectories for balanced SSFP imaging.

Further objects, features and advantages of the present invention will become apparent from the Detailed Description of the Illustrative Embodiments, which follows, when considered together with the attached drawings.

DETAILED DESCRIPTION OF ILLUSTRATIVE EMBODIMENTS

The problem of imperfections (i.e., artefacts) in the balanced TrueFISP sequence scheme arising due to eddy-currents related residual magnetic fields, or uncompensated first order phase encoding gradient moments in the presence of flow or motion, are addressed by the method of MR imaging of the present invention. The method, in accordance with the present invention, is generic in that it is generally independent of the particular MR system and related sequence parameters used. Instead, the present invention is broadly applicable to MR imaging systems that utilize TrueFISP sequences, such as the nuclear magnetic resonance apparatus disclosed in U.S. Pat. No. 4,769,603 to Oppelt et al., which is incorporated herein by reference in its entirety. To facilitate an easy understanding of the present invention, the method in accordance with the present invention will be described generally first, then specific examples and a specific algorithm will be described.

The TrueFISP MR imaging method, in accordance with the present invention, utilizes two techniques to compensate for eddy-current related residual spin-dephasing artefact, and flow or motion related residual spin-dephasing artefact. For the purposes of this disclosure, these two techniques are respectively referred to as (1) the Paring Technique, and (2) the "Through Slice Equilibration" technique.

Pairing Technique

The MR imaging, using the "Pairing" method, in accordance with the present invention, is based on using the intrinsic dynamical properties of TrueFISP itself to minimize or compensate for artefacts caused by eddy currents. Specifically, the dynamic equilibrium state consists of two alternating steady-states where the magnetization vector oscillates back and forth between these dual states. As a rule a paired view ordering is introduced that is based on this "dual" principle. In one embodiment of the present invention, the method groups the entire phase encoding view ordering into adjacent pairs, e.g. line n is grouped with n±1, followed by line m grouped with m±1, and so on (see FIG. 4 for a graphical example of "pairing" of a random trajectory). Linear view ordering (a.k.a. standard view ordering) is one special embodiment of the general application of the "pairing" method in accordance with the present invention.

More particularly, starting out with an ensemble of perfectly phased spins in state "one" (i.e., excitation of spins into state "one"), the encoding of line n results in an eddy-current, or motion related, residual dephasing, $\Delta\Phi(n)$, of steady-state magnetization due to the switching of phase encoding gradients, flow or eddy-currents (encoding line: n) $\Delta\Phi(n) \rightarrow$
(Reference: state "one").

Succeeding excitation into state "two" (i.e., alternating rf-scheme generates cyclic switches between state "one" and state "two"), which mirrors the phase deficiency with respect to state "two" (neglecting relaxational effects). Succeeding encoding of line n+1 (or n−1) generates, due to almost identical phase encoding gradients as compared to encoding of line n, provides essentially similar eddy-currents, $-\Delta\Phi(n)+$flow or eddy-currents (encoding line: n±1)
$\rightarrow -\Delta\Phi(n)+\Delta\Phi(n\pm1)=0$.

Figure 5:
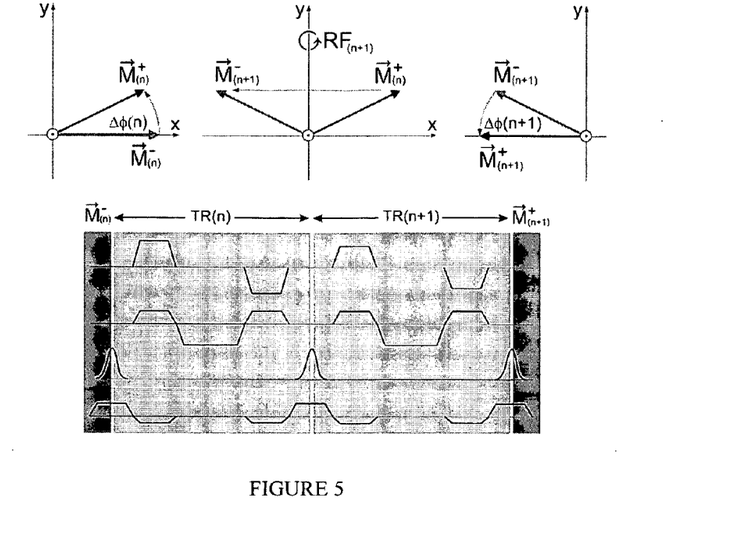
FIG. 5 shows details of "pairing" principle. Cyclic motion of the magnetization vector intrinsically cancels the preceding dephasing, if and only if the phase encoding related imperfections of encoding of line n are almost identical to encoding of line n±1 (or less effective: n±2), which is only true for adjacent thus "paired" k-space lines.

Consequently, due to the cyclic motion of the magnetization vector, such "pairing" of magnetization spins with preceding dephasing spins intrinsically cancels the preceding dephasing by simply reproducing the same phase error into the succeeding step so that the steady-state magnetization of state "two" is thus practically balanced prior to next excitation as detailed graphically in FIG. 5.

The "Through Slice Equilibration" Technique

Figure 6:
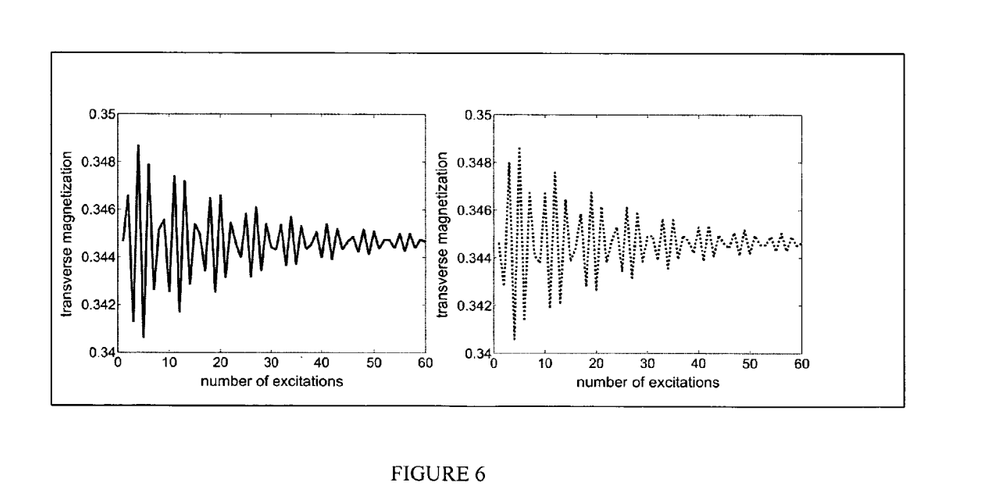
FIG. 6 shows residual spin dephasing (1°) yields in the presence of positive and negative off-resonance frequencies (left: 30°, right −30°) perturbations with opposite phase. Consequently, perturbations at almost identical off-resonance frequencies having opposite sign cancel each other.
Figure 7A:
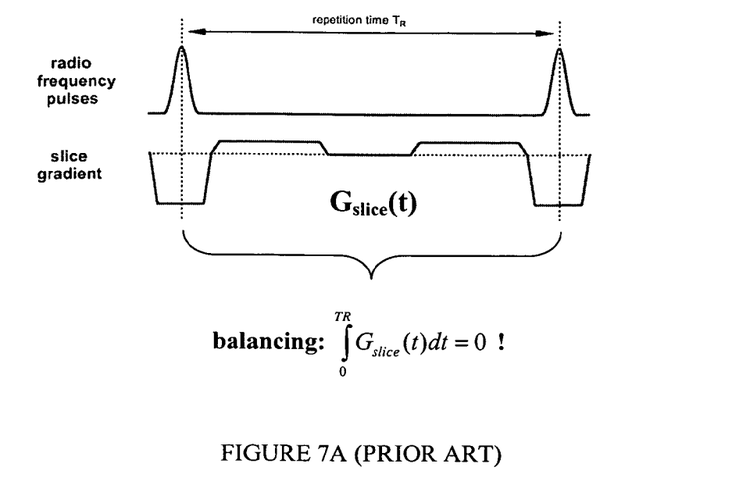
FIG. 7A shows a prior art balanced slice selection gradient.
Figure 7B:
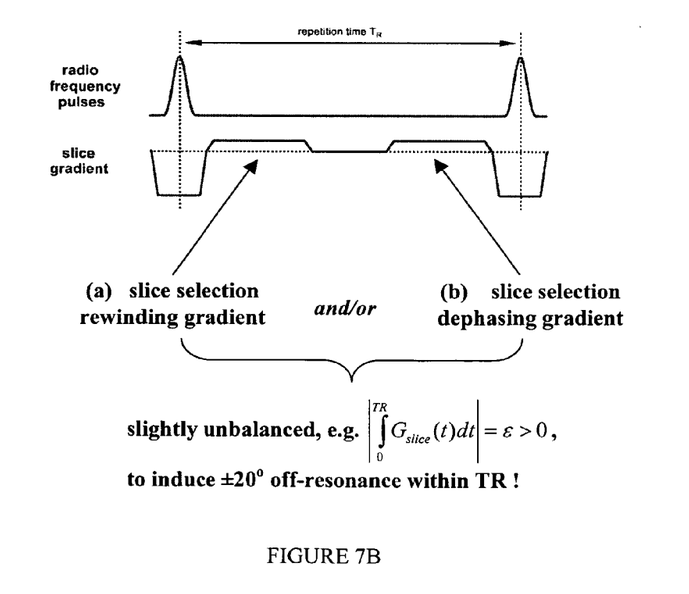
FIG. 7B shows that slightly unbalancing the slice selection gradient by modification of the zeroth order moment of the slice-selection rewinding gradient induces a voxel-independent but constant symmetric low angle dephasing (off-resonance), thus equilibrating eddy-current and flow related signal oscillations due to the opposite phase property.

The "Through slice Equilibration" method, in accordance with the present invention, is based on using the observation that flow or eddy-current related residual spin dephasing yields, in the presence of positive and negative off-resonance frequencies, mirrored perturbations. Therefore, the signal instability due to a positive off-resonance frequency can be cancelled by an equally negative off-resonance frequency. In this way, the opposite phase property of the positive and negative off resonance frequencies, as shown in FIG. 6, is used to cancel mirrored field perturbations of opposite sign. As a result, symmetric low-angle dephasing along a certain direction, within the imaging voxel, perfectly equilibrates eddy current-related signal oscillations. For balanced SSFP, additional dephasing along read or phase directions will generate increasingly narrow banding artefacts. Therefore, the "through slice equilibration" technique is confined to 2D sequences, where additional low-angle dephasing can be imposed along the slice direction, by introducing a slightly unbalanced slice selection gradient such as depicted in FIG. 7B. The slight unbalancing of the slice selection gradient is introduced, for example, by slightly modifying the zeroth order moment of the slice selection dephasing gradient. As a result, independent by constant symmetric intravoxel low-angle dephasing (off-resonance) is additionally introduced, which equilibrates eddy-current and flow/motion related signals oscillations due to the opposite phase of the induced perturbations at corresponding positive and negative off resonance frequencies.

More particularly, gradients G(t)=(Gx,Gy,Gz)=(read, phase,slice) are balanced, when the zeroth order gradient moment, e.g. the gradient-time integral, is zero within the repetition time interval, e.g.

$$\int_0^{TR} G_{read,phase,slice}(t)dt = 0$$

In prior art TrueFISP methods, all of the three zeroth order gradient moments are balanced ($\int G_{read,phase,slice}(t)dt=0$), e.g. for the slice gradient (also called slice selection gradient). In other words, the slice selection gradient is balanced when $$\int_0^{TR} G_{slice}(t)dt = 0\,!$$

In the "through slice equilibration" method, in accordance with the present invention, the slice selection gradient is slightly unbalanced, which means, that the gradient-time integral in the slice direction is allowed to slightly deviate from zero. This induces a symmetric low-angle dephasing within any imaging voxel in slice direction. The exact amount of unbalancing depends on the desired dephasing. However, in the "through slice equilibration" compensation method, boundaries for intravoxel spin dephasing along slice direction are set to ±20° within TR, since larger amounts of intravoxel spin dephasing did not further improve image quality.

To slightly unbalanced a slice selection gradient is to slightly modify the zeroth order moment (i.e., gradient-time integral) of any of the components of the slice selection gradient. For example, the slice selection rewinding or dephasing gradient (or both) in the standard TrueFISP gradient scheme can be modified, to yield the total desired unbalancing of the slice selection gradient within TR as illustrated in FIG. 7B. In other words, in the case of a slightly unbalanced slice selection gradient, the following condition is required:

$$\left| \int_0^{TR} G_{slice}(t)dt \right| = \varepsilon > 0$$

Specifically, the "through slice equilibration" methods in accordance with the present invention are most effective when the slice selection gradient is slightly unbalanced so as to induce ±20° off-resonance within TR. While slight unbalancing of the zeroth order moment of the slice selection rewinding gradient and/or the slice selection dephasing gradient is illustrated in FIG. 7B, the slight unbalancing of other gradients to yield the same symmetric low-angle dephasing within an imaging voxel in the slice direction are also possible.

The above-mentioned generic compensation techniques, both the pairing and the through slice integration methods, apply to a transient state as well as to the steady-state. Thus, the methods in accordance with the present invention also allow artefact-free imaging in the transient state using arbitrary view-ordering and is not limited to application to steady-state situations.

There are other advantages of the present invention as well. The "pairing" and "through slice equilibration" methods are based on inherent properties of the steady-state itself; consequently, these techniques are generic in the sense that the compensation principles employed are independent from any external parameter. In other words, a change of imaging parameters, and/or using a different imaging system, does not affect the quality of these corrections of artefact, which reveals a strength of these artefact compensating concepts (see FIG. 8). Clearly, the present invention includes "generic" compensation methods for compensating PE-related residual dephasing due to changing residual eddy-current fields or flow or motion in order to perfectly restore image quality, independently of the view ordering used.

Having generally described the present invention, certain specific non-limiting illustrative examples will now be described.

Other Specific Illustrative Examples

Figure 8:
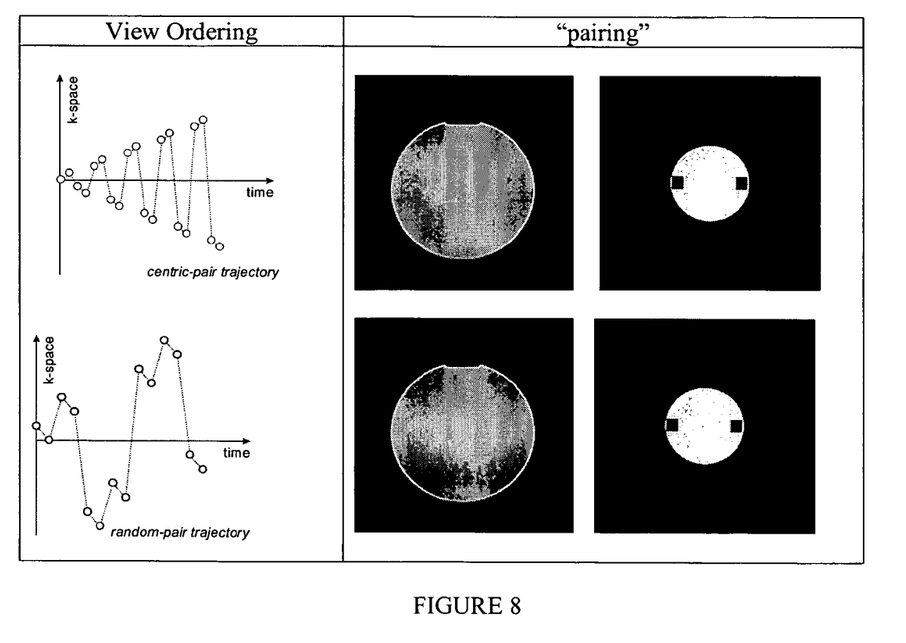
FIG. 8 shows that pairing compensates for eddy-current related image degradations and clearly fully restores image quality and produces artefact free images independent on the view ordering and system (left: Siemens Sonata, right: GE Signa) used.

Implementation of the "pairing" method concept was achieved by a simple modification of the prior art view ordering scheme (see FIG. 2) to generate paired view ordering schemes, such as the paired centric trajectory and the paired random trajectory, being paired segmented trajectories, as presented in FIG. 8. Implementation of the "Through slice equilibration" method concept was achieved by slightly modifying the zeroth order moment of the slice selection dephasing gradient to generate a through-slice dephasing of up to ±50°.

Specifically, as shown in FIG. 8, pairing of adjacent k-space lines results in a pseudo centric and random view ordering, which clearly minimizes image degradation produced by eddy current-related dephasing due to time varying switching of PE gradients when compared to images generated using conventional k-space trajectories shown in FIG. 2. As shown by the open dots representing separate phase encoding steps in the k-space trajectories provided in the first column of FIG. 8, the paired view ordering schemes effectively compensate for eddy current related image degradations. In comparison, eddy current related image degradations or artefacts are plainly present in MR images created using the conventional, non-paired view ordering schemes provided in the first column of FIG. 2.

Figure 9:
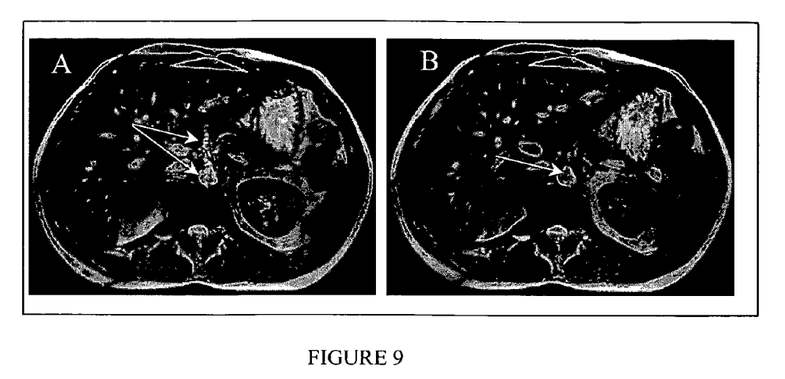
FIG. 9 shows flow artifacts due to the pulsatile flow in the aorta in an axial imaging of the abdomen (matrix 256×256, TR=3.5, bw=890 Hz) using a centric k-space trajectory. (A) The image degradations in PE direction are due to the growing flow related spin-phase variation in the centric encoding scheme. (B) Compensation of flow relate misregistration by grouping adjacent k-space lines thus using a "paired" centric k-space trajectory.

In addition, the "paired" method can compensate for both eddy current and flow or motion related image degradations. As indicated by the white arrows in image A of FIG. 9, residual spin dephasing flow related imperfections, due to blood flow in the aorta, are present in addition to eddy-current related residual spin dephasing imperfections as seen in an axial image of the abdomen of a human subject. Image A of FIG. 9 was obtained using a non-paired centric k-space trajectory. Clearly, as demonstrated by image B of FIG. 9, which was obtained using a paired centric k-space trajectory, both flow as well as eddy-current related image artefacts are fully compensated using the pairing method.

Figure 10:
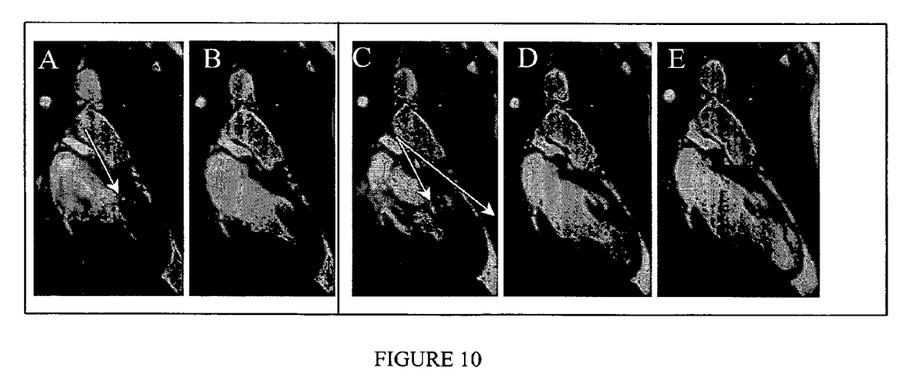
FIG. 10 shows segmented Cine-SSFP imaging (matrix 256×256, TR=5 ms, bw=890 Hz) showing two phases of heartbeat using an equally spaced segmented view-ordering. (A,C) Image artifacts and degradations arise due to the segmentation related larger spin-phase variations. (B,D) Compensation of flow related misregistration and signal loss by grouping adjacent k-space lines thus using a "paired" segmentation. (E) Motion-compensated Cine-SSFP sequence.

The "pairing" method, in accordance with the present invention, can be used to compensate for flow and motion related image degradations as well. Images A and C of FIG. 10 were obtained using a non-paired equally spaced segmented view ordering scheme to image a beating heart. The arrows in images A and C of FIG. 10 indicate motion and flow artefact. Images B and D of FIG. 10 were obtained using a "paired" segmentation view-ordering scheme, in accordance with the present invention, and compensates for flow and motion related artefact. Image E of FIG. 10 was obtained using a motion compensated Cine SSFP sequence. In comparison to a fully motion compensated TrueFISP sequence, such as provides image E of FIG. 10, the pairing method in accordance with the present invention is an easy and effective compensation method for correcting for slow to moderate flow-related signal loss in the steady-state.

Figure 11:
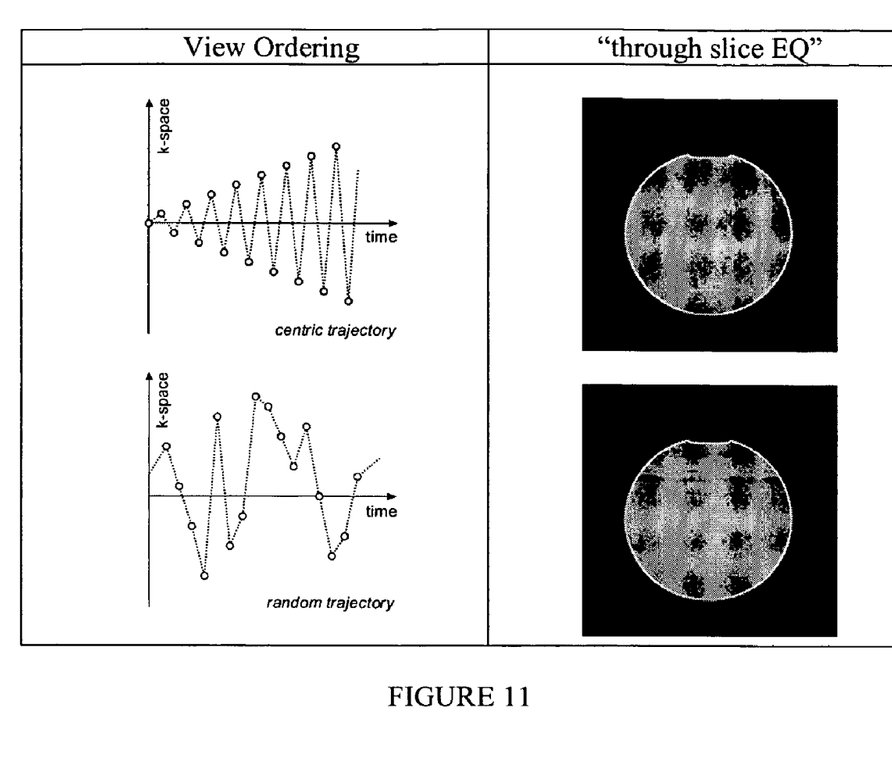
FIG. 11: Comparison of PE eddy current compensation strategies during steady-state for centric (upper row) and random (lower row) view ordering. (A) "Direct" and "through slice equilibration. (B) "Pairing" (left: Siemens Sonata, right: GE Signa).

In FIG. 11, the results of applying the "trough slice equilibration" method, in accordance with the present invention, are shown. In this illustrative example, boundaries for intravoxel spin dephasing in the slice direction for "through slice equilibration" compensation were set to ±20° within repetition time (TR) because continuing increase in intravoxel spin dephasing did not further improve image quality. As shown in FIG. 11, a slightly unbalanced slice-selection gradient induces a voxel-independent but constant symmetric intravoxel off-resonance, which equilibrates eddy-current and flow related signal oscillations due to the opposite phase property thereby yielding artefact-free images independent of the view-ordering used.

In summary, the generic methods in accordance with the present invention, as illustrated by the "pairing" method and the "through slice equilibration" method, are simple to implement, offer great flexibility, are easy to use, and allow complete freedom in selecting view orderings of TrueFISP sequences. More particularly, the "pairing" method permits selection of arbitrary 2D & 3D view-orderings without restriction. The "through slice equilibration" method permits selection of arbitrary 2D view orderings with no restrictions on 2D sequences selected. However, the "through slice equilibration" method is not applicable to 3D sequences. In addition, the generic methods in accordance with the present invention are applicable to both transient and steady-state situations.

In accordance with the present invention, the general method is a method of steady-state free precession MR imaging that is outlined by the following steps: (a) providing a balanced steady-state free precession imaging sequence that includes a plurality of phase encoding steps, wherein each phase encoding step comprises a phase encoding gradient and a slice selection gradient; (b) acquiring imaging data by performing the plurality of phase encoding steps in sequence, wherein the imaging data acquired is compensated for image artefact caused by residual spin dephasing due to either eddy-currents or residual uncompensated first order phase encoding gradient moments arising from flow or motion, or the imaging data acquired is compensated for image artefact caused by residual spin dephasing due to both eddy-currents and residual uncompensated first order phase encoding gradient moments arising from flow or motion, wherein compensation for image artefact is obtained by either performing phase encoding gradients as pairs in k-space, or by performing the slice selection gradient as a slightly unbalanced slice selection gradient in order to achieve through slice equilibrium, or by performing the phase encoding gradient with the paired trajectory and by performing the slice selection gradient as the slightly unbalanced slice selection gradient, and the imaging data is acquired with minimal eddy-current artefact and/or flow or motion related artefact, and (c) generating an image using the imaging data, wherein the image is substantially without image artefact due to eddy currents, flow and/or motion artefact. This generic method is modified, in accordance with the present invention, depending upon whether the pairing method and/or the "through slice equilibration" method steps are employed to compensate for artefact due to eddy currents and flow and/or motion artefact.

It is noted that neither the "pairing" method, nor the "through slice equilibration" method in accordance with the present method minimizes eddy-currents, or reduces flow or motion related dephasing, because these effects stay identically the same during imaging. Instead, these effects, e.g. the disturbances they induce in the steady-state, are compensated for using the methods in accordance with the present invention so that substantially artefact free imaging can be performed that is substantially free of artefacts caused by eddy currents, flow or motion.

Thus, those persons skilled in the art would recognize that the present invention addresses the origin of MRI image artefacts in an important and new way in order to provide certain advantages over prior art MRI imaging methods. Specifically, the origin of MRI image artefact comes from two independent sources: (i) eddy-currents (System-related artefact), and (ii) flow or motion (Object-related artefact). However, both of these system-related artefacts and object-related artefacts induce essentially the same disturbances in steady-state magnetization (e.g. a time-varying residual spin-dephasing due to time-varying phase encoding). Specifically, the variability of phase encoding, and thus spin-dephasing, is directly related to the view-ordering (e.g. on the sequence of phase encoding steps). Consequently, the linear view-ordering trajectory has been the standard trajectory because it minimizes variability due to the fact that a linear trajectory minimizes the overall changes from encoding of line i to the encoding of line i±1. Any other view-ordering trajectories are of limited applicability due to the significant jumps, or changes, between phase encoding lines, which generates instabilities in steady-state magnetization. Consequently, TrueFISP imaging has been previously limited to the use of only linear view-ordering.

In particular, certain effects are always present and can generate artefact during TrueFisp imaging, whereas other artefact causing effects are not always present. More particularly, eddy-currents are always present because they are inherently generated by the system. On the other hand, flow or motion effects may be present or may be absent, depending on the properties (e.g. whether flow or motion is present in the sample or not) of the object being scanned. In some cases, there may only be flow artefacts clearly visible in the scanned image. In other cases, only eddy-current related artefacts are visible in the scanned image, while in still other cases the presence of both eddy current related artefact and flow or motion related artefact is visible in the scanned image. Which effect is strongest (i.e., eddy current, flow, or motion artefact), is dependant on the view ordering trajectory applied, and on the amount of flow present in the sample. For example, TrueFisp imaging of the heart is very prone to distortion by flow-related artefact that is dependant on the view-ordering applied, while eddy-current related artefact plays only a minor role in image distortion when TrueFisp imaging of a beating heart is performed.

Consequently, there are three possible circumstances creating image artefacts as follows: (i) circumstances where the image artefacts are mainly due to eddy-currents, (ii) circumstances where the image artefacts are mainly due to flow or motion related to the object being scanned, and (iii) circumstances where image artefacts are due to both eddy-currents and flow or motion. The present invention provides a method for compensating for these effects and the imaging artefacts they cause regardless of whether one type of image artefact producing effect predominates, or whether there is a combination of the image artefact producing effects. In other words, because eddy current, flow and motion disturbances result in the same action on steady-state magnetization, namely residual spin-dephasing, these disturbances can be compensated for by using the compensation methods in accordance with the present invention. Specifically, the methods in accordance with the present invention employ different mechanisms to compensate for residual-spin-dephasing: (a) "Pairing" and (b) "Through slice Equilibration" mechanisms.

Next, several additional comments regarding the "pairing" method of artefact compensation, in accordance with the present invention, are made. Generally, image data consists of acquiring N lines (N=128,256,512, . . . or any other natural number), by using N different phase encoding steps and thus N different phase encoding gradients. These N steps can be passed arbitrarily, thus there are N! (N*(N−1)*(N−2)* . . . *2*1) possible ways or "trajectories" for acquiring the N lines. In other words, there are N! possible view-orderings that could be employed. However, variation in phase encoding gradients are minimal, and to some degree smooth, for adjacent lines (e.g. n and (n+1) or (n−1)), where n is any arbitrary number between 1 and N. The linear view-ordering, which is the standard view-ordering, consists of passing the lines in ascending or descending order. Linear view-ordering is presently the standard method used for TrueFISP imaging. Any other view-ordering (i.e., combination of lines 1 . . . N) is constrained regarding how significant a change, e.g. jumps, in phase encoding gradients can be made because unsmooth changes in the k-space trajectory are mirrored by image artefacts, which are a consequence of an unstable steady-state resulting from these unsteady changes in the view-ordering trajectory.

Figure 4:
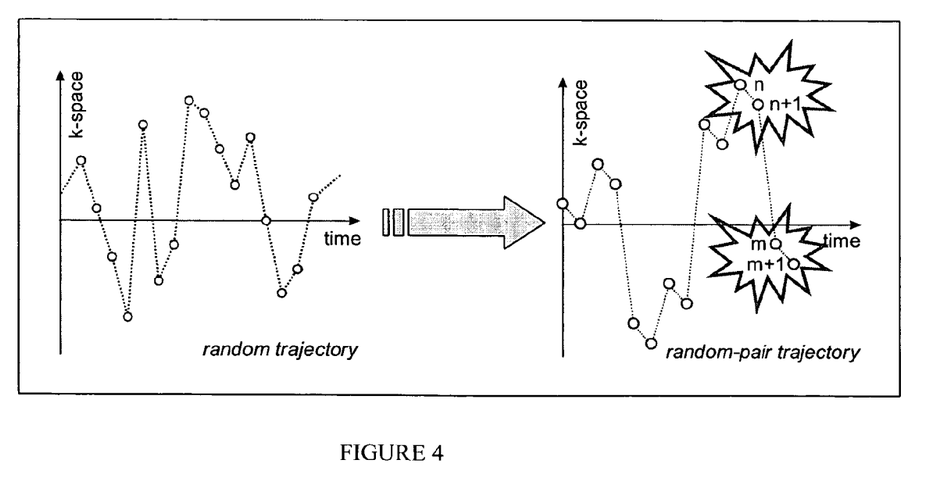
FIG. 4 illustrates the "Pairing" principle. The only constraint imposed on the view-ordering is the "pairing" of adjacent k-space lines to a new identity.

In the strict mathematical sense, dynamic equilibrium for TrueFisp consists of a "dual" steady-state provided by a coherent pair of steady-states with opposite phase properties. During this dynamic equilibrium there is a cyclic motion between these two states. This dynamic equilibrium property can be harnessed to perform an intrinsic compensation of residual spin dephasing (i.e., residual spin phase errors), namely by "welding" or "PAIRING" two adjacent lines as illustrated in FIGS. 4 and 8, wherein the entire set of lines (N) are grouped in pairs of two adjacent lines. Consequently, in any paired view-ordering, for any line i in the set of lines N, there exists an adjacent line i+1 or i−1. Thus, the degree of freedom in line ordering is slightly reduced. In particular, the linear-view-ordering is one special realization of paired view-ordering, although the present invention is not limited to linear-view ordering.

While "pairing" in accordance with the present invention is best performed using adjacent lines as described above, the present invention is not limited to pairing of adjacent lines. For example, a less effective but still acceptable compensation for the artifact effects previously described can be achieved for any line i in the set of lines N, when there exist an almost adjacent line i+2, or i−2. In other words, a line i can be paired with an almost adjacent line i+2 or i−2 instead of with an adjacent line i+1 or i−1 and still achieve acceptable artefact compensation results.

Next, several additional comments regarding the "through slice equilibration" method of artefact compensation, in accordance with the present invention, are made. In particular, slightly unbalancing the slice selection gradient, such as by modification of the zeroth order moment of the slice selection dephasing gradient, can be employed, in accordance with one embodiment of the present invention, to induce a voxel independent, symmetric intravoxel off-resonance for the purpose of compensating for eddy current artefact, and/or flow or motion artefact. However, the "through slice equilibration" methods in accordance with the present invention are not limited to using modified slice selection dephasing gradients. In accordance with other embodiments of the present invention, voxel independent, symmetric intravoxel off-resonance can be obtained by modification of the zeroth order moment of the slice selection rewinding gradient, or by modification of the zeroth order moment of both the slice selection dephasing and rewinding gradient, or any other zeroth order moment of any other component of the slice selection gradient.

It is noted that artefact compensated methods of steady-state free precession MR imaging in accordance with the present invention may employ either the "Pairing method" or the "Through slice equilibration" method for compensating for eddy current, and/or flow or motion artefact. In accordance with the present invention, these two methods can be employed concurrently to compensate for artefact in a combined manner. Thus, while both compensation methods are stand-alone methods, they can be combined. Therefore, artefact compensation methods in accordance with the present invention may employ (i) "Pairing" only, (ii) "Through slice equilibration" only, or (iii) "Pairing" and "Through slice equilibration" methods in combination.

While the present invention has been generally described with respect to pairing in Cartesian k-space, the present invention is also applicable to pairing of radial k-space lines used in radial scanning. More particularly, the methods described above generically correct for eddy current, and/or flow or motion artefacts, but not for the underlying cause (i.e., eddy currents, flow or motion) of abrupt and fast changes in eddy-current related residual spin-dephasing on steady-state magnetization. Therefore, the artefact compensation methods in accordance with the present invention are not restricted to Cartesian k-spcae sampling. For k-space sampling on non-cartesian grids, such as radial sampling schemes, large and abrupt changes of the encoding gradients result in eddy current-related residual spin dephasing, which causes signal instabilities similar to those observed with Cartesian k-space sampling. Consequently, the "pairing" and "through slice equilibration" techniques employed by the methods of the present invention are equally employable to compensating for these artefacts whether observed during either Cartesian or non-cartesian k-space sampling. Thus, the methods in accordance with the present invention increase the flexibility in the design of non-cartesian k-space trajectories for balanced SSFP.

Figure 12:
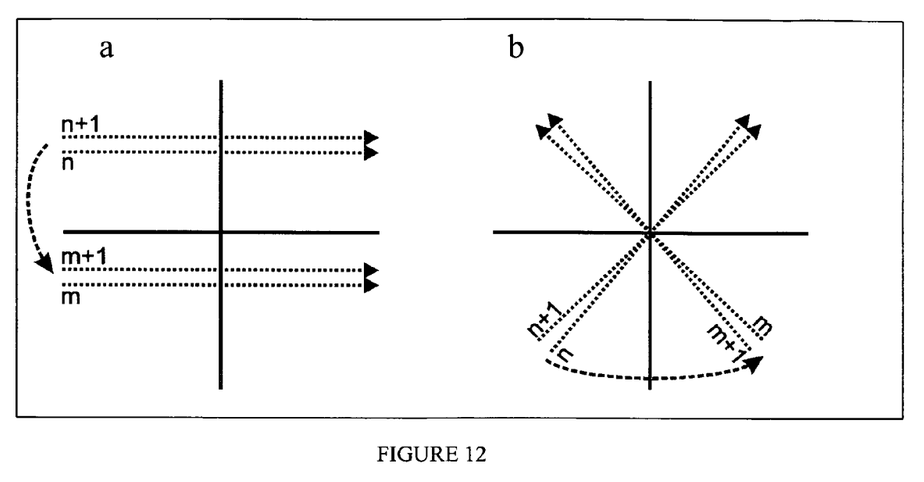
FIG. 12 illustrates the "pairing" principle for sampling on cartesian and non-cartesian grids, wherein (a) paired k-space lines on a cartesian grid are shown in comparison to (b) paired radial k-space lines, corresponding to projection reconstruction or radial scanning, using non-cartesion grids.

FIG. 12 provides a comparison of "pairing" as applied to Cartesian k-space and to non-cartesian k-space. Large jumps in k-space position induce rapid and abrupt changes in the corresponding encoding gradients and, thus, in eddy-currents resulting in residual eddy-current related spin-dephasing. Pairing of adjacent k-space lines, as illustrated in FIG. 12, allows for (a) large jumps between paired adjacent cartesian k-space positions when cartesian view ordering is used, and (b) allows for large changes in tha azimthal angle of paired adjacent radial k-space lines when radial view ordering is used.

Specifically, eddy-current related perturbations in steady-state magnetization are due to large and rapid changes of encoding gradients, and therefore do not rely on the sampling grid used. In other words, the eddy-current related perturbations are independent of whether the sampling grid employed is cartesian or non-cartesian. Radial k-space lines are better characterized by polar coordinates $(r,\phi,\theta)$ rather than by using cartesian coordinates $(x,y,z)$. Nearby or adjacent radial k-space lines are characterized by similar angular values $(\phi,\theta)$. The linear, e.g. "standard," radial view ordering consists of a smooth minimal stepwise increase or decrease of $(\phi,\theta)$ values. Large changes in the angles $(\phi,\theta)$ of the radial k-space trajectories will induce rapid and abrupt changes in eddy current-related spin-dephasing and thus instabilities in steady-state magnetization similar to Cartesian trajectories. Consequently, restrictions for radial trajectories are the same as the restrictions for view ordering on Cartesian grids. Thus, pairing of adjacent radial k-space lines, such as shown in FIG. 12, can be employed to correct the resulting artefacts when radial grids are used instead of cartesian grids. This ability to employ the pairing methods in accordance with the present invention to radial view ordering offers greater flexibility in the design of non-cartesian 2D and 3D k-space trajectories for balanced SSFP.

While the present invention has been described with reference to certain illustrative embodiments, one of ordinary skill in the art will recognize that additions, deletions, substitutions, modifications and improvements can be made while remaining within the spirit and scope of the present invention as defined by the appended claims.

What is claimed is:

1. A method of steady-state free precession MR imaging comprising the steps of:
   providing a balanced steady-state free precession imaging sequence that includes a plurality of phase encoding steps, wherein each phase encoding step comprises a phase encoding gradient and a slice selection gradient; and
   acquiring imaging data by performing the plurality of phase encoding steps in sequence, wherein the imaging data acquired is compensated for image artefact caused by residual spin dephasing due to either eddy-currents or residual uncompensated first order phase encoding gradient moments arising from flow or motion, or the imaging data acquired is compensated for image artefact caused by residual spin dephasing due to both eddy-currents and residual uncompensated first order phase encoding gradient moments arising from flow or motion, wherein compensation for image artefact is obtained by either performing phase encoding gradients as pairs in k-space, or by performing the slice selection gradient as a slightly unbalanced slice selection gradient in order to achieve through slice equilibrium, or by performing the phase encoding gradient with the paired trajectory and by performing the slice selection gradient as the slightly unbalanced slice selection gradient.

2. A method as recited in claim 1, wherein the sequence of the phase encoding steps is performed with a k-space trajectory that compensates for effects of eddy-currents, or flow, or eddy currents and flow.

3. A method as recited in claim 2, wherein the k-space trajectory is a paired trajectory, wherein a first phase encoding step is paired with and precedes a second phase encoding step so that cyclic motion of steady-state magnetization projects a phase error generated by the first phase encoding step into a phase error, with opposition sign, of the second encoding step so that coding of a nearby line repeats almost the same phase error, thereby cancelling overall phase error prior to a next excitation.

4. A method as recited in claim 3, wherein the k-space trajectory is arbitrary so that any encoding of line i precedes or follows encoding of line i+1, or precedes or follows encoding of i+2.

5. A method as recited in claim 4, further comprising the step of:
   generating an image using the imaging data, wherein the image is substantially without image artefact due to eddy currents, or flow, or eddy currents and flow.

6. A method as recited in claim 4, wherein slight unbalancing of the slice selection gradient is due to modification of the zeroth order moment of components of the slice selection gradient selected from the group consisting of a slice selection rewinding gradient, a slice selection dephasing gradient, and a slice selection rewinding and dephasing gradient, wherein the unbalanced gradient induces a voxel independent, symmetric intravoxel off-resonance that is constant and compensates for one or more effects due to eddy currents, flow, or motion by equilibrating signal oscillations at positive off-resonance frequencies with ones at equally negative off-resonance frequencies.

7. A method as recited in claim 6, further comprising the step of:
   generating an image using the imaging data, wherein the image is substantially without image artefacts due to eddy currents.

8. A method as recited in claim 6, further comprising the step of:
   generating an image using the imaging data, wherein the image is substantially without image artefacts due to eddy currents and substantially without image artefacts due to flow or motion.

9. A method as recited in claim 1, wherein slight unbalancing of the slice selection gradient is due to modification of the zeroth order moment of components of the slice selection gradient selected from the group consisting of a slice selection rewinding gradient, a slice selection dephasing gradient and a slice selection rewinding and dephasing gradient, wherein the unbalanced gradient induces a voxel independent, symmetric intravoxel off-resonance that is constant and compensates for one or more effects due to eddy currents, flow, or motion by equilibrating signal oscillations at positive off-resonance frequencies with ones at equally negative off-resonance frequencies.

10. A method as recited in claim 9, further comprising the step of:
    generating an image using the imaging data, wherein the image is substantially without image artefact due to eddy currents.

11. A method as recited in claim 9, further comprising the step of:
    generating an image using the imaging data, wherein the image is substantially without image artefact due to flow or motion.

12. A method as recited in claim 9, further comprising the step of:
    generating an image using the imaging data, wherein the image is substantially without image artefact due to eddy currents and substantially without image artefact due to flow or motion.

13. A method as recited in claim 1, wherein the sequence of the phase encoding steps is performed with a k-space trajectory that is a paired trajectory selected from the group consisting of a linear pair trajectory, a centric pair trajectory, a segmented pair trajectory, and a random pair trajectory.

14. A method as recited in claim 1, wherein the k-space is either a cartesian k-space or a non-cartesian k-space.

* * * * *